(12) United States Patent
Lee et al.

(10) Patent No.: US 10,824,071 B2
(45) Date of Patent: Nov. 3, 2020

(54) METHOD OF EXPOSING A SEMICONDUCTOR STRUCTURE, APPARATUS FOR CONTROLLING A LITHOGRAPHY PROCESS PERFORMED BY A LITHOGRAPHY APPARATUS ACROSS A SEMICONDUCTOR STRUCTURE, NON-TRANSITORY COMPUTER READABLE MEDIUM HAVING INSTRUCTIONS STORED THEREON FOR GENERATING A WEIGHT FUNCTION

(71) Applicant: SAMSUNG ELECTRONICS CO., LTD., Suwon-si (KR)

(72) Inventors: Moo-song Lee, Seoul (KR); Seung-yoon Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/431,233

(22) Filed: Jun. 4, 2019

(65) Prior Publication Data

US 2020/0110332 A1     Apr. 9, 2020

(30) Foreign Application Priority Data

Oct. 8, 2018   (KR) .......................... 10-2018-0119963

(51) Int. Cl.
| | |
|---|---|
| *G03B 27/32* | (2006.01) |
| *G01B 11/00* | (2006.01) |
| *G03F 1/72* | (2012.01) |
| *H01L 23/544* | (2006.01) |
| *G03F 1/42* | (2012.01) |

(Continued)

(52) U.S. Cl.
CPC ................. *G03F 1/72* (2013.01); *G03F 1/42* (2013.01); *G03F 7/16* (2013.01); *G03F 7/20* (2013.01); *G03F 7/70633* (2013.01); *G03F 9/7088* (2013.01); *H01L 22/12* (2013.01);
(Continued)

(58) Field of Classification Search
CPC .... G03F 7/70633; G03F 7/705; G03F 9/7003; G03F 7/70616; G03F 7/70625; G03F 1/42; G03F 7/70425; G03F 9/7088; G03F 7/70516; G03F 9/7019
See application file for complete search history.

(56) References Cited

U.S. PATENT DOCUMENTS

| | | |
|---|---|---|
| 5,525,808 A | 6/1996 | Irie et al. |
| 7,103,497 B2 | 9/2006 | Matsumoto et al. |

(Continued)

FOREIGN PATENT DOCUMENTS

| | | |
|---|---|---|
| JP | 2004-103932 | 4/2004 |
| JP | 2004-200632 | 7/2004 |

(Continued)

*Primary Examiner* — Mesfin T Asfaw
(74) *Attorney, Agent, or Firm* — F. Chau & Associates, LLC

(57) ABSTRACT

Multiple model functions may be calculated by detecting alignment marks on a semiconductor wafer structure. The model functions may be combined to determine a combined model function by using a weight function that assigns a different weight to each of basis functions of the model functions. Thus, even when asymmetry of alignment marks or overlay marks has high dependency on a horizontal location on a wafer, reliability of exposure process is insured.

20 Claims, 9 Drawing Sheets

(51) Int. Cl.
    *G03F 7/16* (2006.01)
    *G03F 9/00* (2006.01)
    *G03F 7/20* (2006.01)
    *H01L 21/66* (2006.01)
(52) U.S. Cl.
    CPC .... *H01L 23/544* (2013.01); *H01L 2223/5446* (2013.01); *H01L 2223/54426* (2013.01)

(56) References Cited

U.S. PATENT DOCUMENTS

| | | |
|---|---|---|
| 7,321,432 B2 | 1/2008 | Hill |
| 7,414,722 B2 | 8/2008 | Van Bilsen |
| 7,565,219 B2 | 7/2009 | Van Der Schaar et al. |
| 8,363,220 B2 | 1/2013 | Coene et al. |
| 8,947,642 B2 | 2/2015 | Middlebrooks |
| 8,982,347 B2 | 3/2015 | Wei et al. |
| 9,543,223 B2 | 1/2017 | Habets |
| 9,710,728 B2 | 7/2017 | Pandev et al. |
| 9,927,717 B2 | 3/2018 | Rhe et al. |
| 2004/0126004 A1 | 7/2004 | Kikuchi |
| 2007/0064232 A1 | 3/2007 | Yang et al. |
| 2010/0245792 A1 | 9/2010 | Bijnen et al. |
| 2013/0060354 A1 | 3/2013 | Choi et al. |
| 2014/0212817 A1* | 7/2014 | Habets ............... G03F 7/70633 430/319 |
| 2018/0046737 A1 | 2/2018 | Willems et al. |

FOREIGN PATENT DOCUMENTS

| | | |
|---|---|---|
| JP | 2006-108533 | 4/2006 |
| JP | 4840684 | 12/2011 |
| KR | 10-1998-0021245 | 6/1998 |
| WO | WO2008-139955 | 8/2010 |
| WO | 2014068116 | 5/2014 |

* cited by examiner ated Korean Patent Application No. 10-2018-0119963, filed on Oct. 8, 2018, in the Korean Intellectual Property Office, the disclosure of which is incorporated by reference in its entirety herein.

BACKGROUND

The inventive concept relates to a lithography method and a lithography apparatus, and more particularly, to a lithography method and a lithography apparatus having improved reliability.

To manufacture a semiconductor device, various semiconductor processes are performed on a wafer including a semiconductor material. The semiconductor processes may include, for example, a deposition process in which a material layer is deposited on the wafer, a photolithography process for defining a pattern on the wafer, an etching process in which the material layer on the wafer is etched, a process of injecting impurities into the wafer, etc. By performing these semiconductor processes, the semiconductor device may be formed based on a designed layout.

Various methods may be used for determining the states of the semiconductor processes, and whether there are defects after performing processes. For example, a lithography apparatus may estimate differences in the designed position of elements in a layer of a semiconductor with the actual position of the element. However, as semiconductors become smaller and thinner, the estimated differences may become less accurate, which may result in a less reliable semiconductor manufacturing process.

SUMMARY

The inventive concept provides a method of calculating a combined model function for minimizing a size of an overlay error and a variance of the same, a method of setting a lithography apparatus, a lithography method, and a lithography apparatus.

According to an aspect of the inventive concept, there is provided a method of calculating a method of exposing a semiconductor structure, the method including providing a semiconductor structure to a lithography apparatus, the semiconductor structure comprising a wafer, a first layer arranged on the wafer and comprising a plurality of alignment marks and a plurality of overlay marks, a second layer arranged on the first layer, and a photoresist material layer arranged on the second layer, identifying locations of the plurality of alignment marks by using a plurality of lights having different wavelengths, obtaining a plurality of model functions each representing differences between designed locations of the plurality of alignment marks and locations of the plurality of alignment marks identified by the plurality of lights, forming a photoresist pattern comprising a plurality of overlay mark molds by exposing the photoresist material layer by using a first model function from among the plurality of model functions, measuring overlay errors representing misalignment between the plurality of the overlay marks and the plurality of overlay mark molds, obtaining a combined model function by combining the plurality of model functions using a weight function, wherein each of the plurality of model functions comprises basis functions, and wherein the weight function assigns a different weight for each of the basis functions of each of the plurality of model functions.

According to another aspect of the inventive concept, there is provided a method of exposing a semiconductor substrate, the method including providing a first semiconductor structure to a lithography apparatus, the first semiconductor structure comprising a first wafer having an upper surface extending in a first direction and a second direction, a first layer arranged on the first wafer and comprising a plurality of first alignment marks and a plurality of first overlay marks, a second layer arranged on the first layer, and a first photoresist material layer arranged on the second layer, obtaining first and second model functions each representing differences between designed locations of the plurality of first alignment marks and locations of the plurality of first alignment marks identified by first and second lights, wherein each of the first and second model functions is a linear combination of basis functions, forming a first photoresist pattern comprising a plurality of first overlay mark molds by exposing the first photoresist material layer by using the first model function, measuring overlay errors representing misalignment between the plurality of the first overlay marks and the plurality of first overlay mark molds, obtaining a weight function by combining the first and second model functions to provide a first combined model function by assigning a different weight for each of the basis functions, and exposing second semiconductor structures designed to be same as the first semiconductor structure, using the weight function.

According to another aspect of the inventive concept, there is provided a method of exposing a semiconductor substrate, the method including providing a semiconductor structure to a lithography apparatus, the semiconductor structure comprising a wafer, a first layer arranged on the wafer and comprising a plurality of alignment marks and a plurality of overlay marks, a second layer arranged on the first layer, and a photoresist material layer arranged on the second layer, obtaining first through fourth model functions each representing differences between designed locations of the plurality of the first alignment marks and locations of the plurality of the first alignment marks identified by first through fourth lights, wherein each of the first through fourth model functions is a linear combination of basis functions, obtaining a combined model function by combining the plurality of model functions using a weight function, the weight function assigning a different weight for each of the basis functions of each of the plurality of model functions, and exposing the semiconductor structures using the combined model function.

According to another aspect of the inventive concept, there is provided a lithography apparatus including an exposure device configured to expose a semiconductor structure, the semiconductor structure comprising a wafer, a first layer arranged on the wafer and comprising a plurality of first alignment marks and a plurality of overlay marks, and a second layer arranged on the first layer and photoresist material layer on the second layer, and a lithography controller configured to control the exposure device to expose the semiconductor structure using a plurality of model function and a weight function, wherein the plurality of model functions comprise basis functions, which are functions having coordinates of locations on the wafer as variables, and wherein the weight function assigns a different weight for each of the basis functions of each of the plurality of model functions.

According to another aspect of the inventive concept, there is provided an apparatus for controlling a lithography process performed by a lithography apparatus across a semiconductor structure configured to: use alignment mark locations identified by a plurality result locations to generate a plurality of model functions, each of the plurality of model functions comprising basis functions, generate a combined model function by combining the plurality of model functions using a weight function, the weight function assigning a different weight for each of the basis functions of each of the plurality of model functions, and control the lithographic process using the combined model function.

According to another aspect of the inventive concept, there is provided a non-transitory computer readable medium having instructions stored thereon for generating a weight function, the instructions, when executed by one or more processors, causing the one or more processors to: use alignment mark locations on a wafer identified by a plurality result locations to generate a plurality of model functions, each of the plurality of model functions comprising basis functions, obtain a real location of an arbitrary element on the wafer by using the plurality of model functions, and generate a combined model function by combining the plurality of model functions using a weight function, the weight function assigning a different weight for each of the basis functions of each of the plurality of model functions. wherein the weight function is determined such that an average of a variance of a combined overlay error representing a difference between a location of the arbitrary element determined based on the combined model function and the real location of the arbitrary element with respect to the plurality of first semiconductor structures has a least value.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
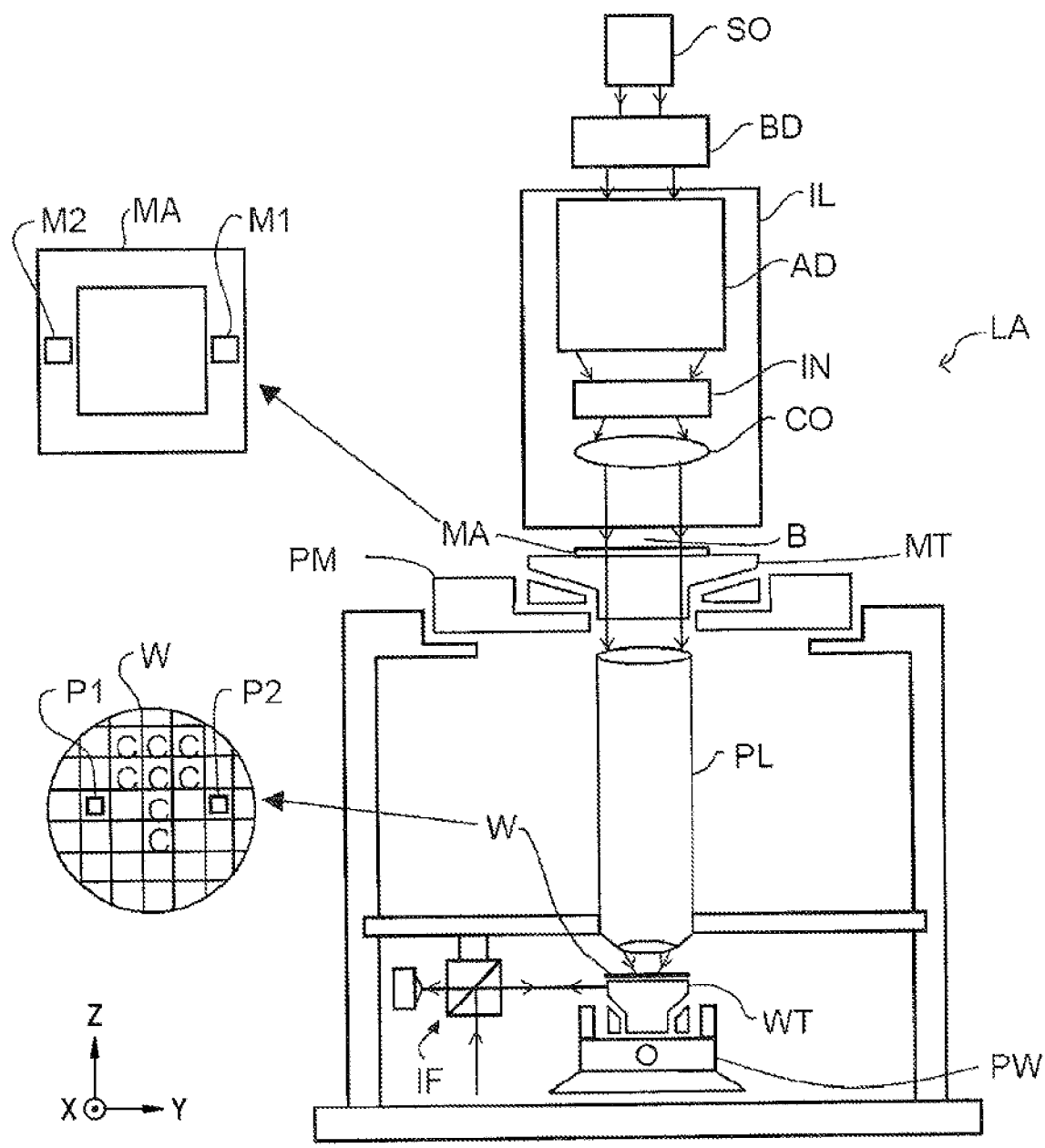
FIG. 1 is a schematic cross-sectional view of a lithography apparatus, which may be used in a method of exposure and a method of manufacturing a semiconductor device, according to embodiments.

Hereinafter, embodiments will be described in detail by referring to the accompanying drawings. Like reference numerals refer to the like elements and their descriptions will not be repeated. Various embodiments of the present disclosure relate so systems and methods for determining the difference between a designed location of an arbitrary element on a semiconductor wafer and an actual location of the element. Model functions representing this difference for each location on the wafer may be calculated based on alignment marks in a layer of the semiconductor.

In some examples, the model functions may be calculated using a plurality of lights having different wavelengths. That is, in some cases asymmetries in the alignment marks may result in different results based on what wavelength of light is used to measure their location. Thus, some systems use different lights with different wavelengths to account for the potential asymmetries in the alignment marks. In some examples, the model functions calculated based on the different wavelengths may be represented as a sum of basis functions (each function having a different coefficient). A combined model function may be calculated by taking a linear combination of the coefficients for each of the basis functions.

However, taking a linear combination of the basis functions may not account for asymmetries that arise from the location of the alignment marks. Thus, according to embodiments of the present disclosure, a combined model function may be calculated using a weighted combination of the basis functions (i.e., using a different weight for each of the basis functions). In some cases, the weighting function may be based on the type of basis function being used.

For example, the basis functions may include monomial functions, discontinuous Chebyshev polynomials, Zernike polynomials or other suitable basis functions. When discontinuous Chebyshev polynomials are used, a different weighting function may be used to combine the model function than when Zernike polynomials are used. By using a weighting function assigning different weights to different basis functions, the system may predict or calculate location dependent asymmetry. Thus, even when the location dependency of the asymmetry of the alignment marks or the overlay marks is significant, the combined model function may still be reliable.

Once the combined model function is calculated, it may be used to adjust the positioning of subsequent semiconductor structures (or the position of the lithographic exposures that are used to generate patterns on the semiconductor structure). In some cases, the combined model function may be based on, or used in conjunction with another function that measures an overlay error. Using the combined model function described herein to perform interlayer alignment may improve the overall reliability of the lithography apparatus, which may increase yield and improve efficiency of the semiconductor manufacturing process.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

FIG. 1 is a schematic cross-sectional view of a lithography apparatus LA that may be used in a method of exposure and a method of manufacturing a semiconductor device, according to embodiments. The lithography apparatus LA may function based on the calculation of model functions (and overlay functions) that serve to indicate the accuracy of radiation beams B of the lithography apparatus LA being used to generate patterns on layers of a wafer W.

The lithography apparatus LA may include a source SO, an illuminator IL, a patterning device MA, a first location setter PM, a mask table MT, a second location setter PW, a wafer table WT, and a projection system PL.

Here, two directions substantially parallel with an upper surface of the wafer W arranged inside the lithography apparatus LA and substantially perpendicular to each other are defined as a first direction and a second direction (an X direction and a Y direction). Also, a direction substantially perpendicular to the upper surface of the wafer W is defined as a third direction (a Z direction). The definition of the directions is the same throughout the drawings, unless mentioned otherwise.

The source SO may emit, for example, radiation beams B, such as ultraviolet rays, excimer laser beams, extreme ultraviolet (EUV) rays, X rays, or electron beams. In various embodiments, the source SO may be a component included in the lithography apparatus LA or may be a component separate from the lithography apparatus LA. For example, when the source SO is an excimer laser, the source SO may be a separate component from the lithography apparatus LA. In this case, the radiation beams B are transferred from the source SO to the illuminator IL by a beam transferring system BD including a beam expander. When the source SO is a mercury lamp, the source SO may be a component included in the lithography apparatus LA.

The illuminator IL may accommodate the radiation beams B from the source SO. The illuminator IL may orient a direction of the radiation beams B toward a set direction, form a shape of the radiation beams B, or control the radiation beams B. In some embodiments, the illuminator IL may include optical components of various types, such as a refractive type optical component, a reflective type optical component, a magnetic type optical component, an electromagnetic type optical component, a capacitance type optical component, or a combination thereof. The illuminator IL may include an adjustor AD adjusting an intensity distribution based on angles of the radiation beams B. The adjustor AD may adjust a size of an outer radius and/or a size of an inner radius of the intensity distribution of a pupil plane of the illuminator IL. The illuminator IL may adjust the radiation beams B such that a cross-section of the radiation beams B has a required uniformity and a required intensity distribution.

The mask table MT may support the patterning device MA. The mask table MT may use mechanical, vacuum, electrostatic, or other clamping techniques to support the patterning device MA. In some embodiments, the mask table MT may be a fixed frame or table. In other embodiments, the mask table MT may be a movable frame or table. The mask table MT may locate the patterning device MA in a location that is set with respect to the projection system PL. The radiation beams B may be incident to the patterning device MA supported by the mask table MT. A cross-section of the radiation beams B incident into the patterning device MA may be changed to a shape set for the patterning device MA. The projection system PL may include a refractive type, a reflective type, a catadioptric type, a magnetic type, an electromagnetic type, and an electrostatic optical type, and a combination thereof.

In some embodiments, the patterning device MA may be a transparent type or a reflective type. An example of the patterning device MA may include any one of a mask, a programmable mirror array, and programmable LCD panels. When the patterning device MA is a mask type, the patterning device MA may include a binary type, an alternate phase-shift type, an attenuation phase-shift type, or various hybrid types.

When the patterning device MA is a programmable mirror array, the patterning device MA may include, for example, a set of small mirrors arranged as a matrix shape. The small mirrors included in the patterning device MA may be separately inclined to reflect radiation beams incident into the small mirrors in different directions. The inclined small mirrors may give a pattern to the radiation beams B reflected by a mirror matrix.

Next, the radiation beams B may pass through the projection system PL. The projection system PL may focus the radiation beams B on a target portion C of the wafer W. In some embodiments, the second location setter PW and a location sensor IF may drive the wafer table WT such that the radiation beams B are sequentially focused on the target portion C of the wafer W arranged on the wafer table WT. Referring to FIG. 1, the lithography apparatus LA includes one wafer table WT and one second location setter PW, but is not limited thereto. The lithography apparatus LA may include a plurality of (for example, two) wafer tables and a plurality of second location setters, and in this case, wafers arranged on the different wafer tables may be alternately and sequentially exposed.

In some embodiments, the second location setter PW may drive the wafer table WT to realize a designed circuit pattern. In some embodiments, the second location setter PW may drive the wafer table WT such that the radiation beams B are focused on a location set on the wafer W. The location set on the wafer W may be determined based at least in part on a combined model function calculated by using wafer alignment marks P1 and P2 as described below. The second location setter PW may drive the wafer table WT such that a layer formed on the wafer W and an underlying layer are aligned with each other based on a lithography process to form a semiconductor device. For example, the interlayer alignment of a wafer structure may be based on the calculation of model functions, which in turn depend on the detection of alignment marks on the wafer W.

In some embodiments, a space between the projection system PL and the wafer W may be filled with a liquid having high refractive index, such as water. In some embodiments, at least a portion of the wafer W may be covered by the fluid. The fluid is referred to as an immersion fluid, and the immersion fluid may fill other spaces in the lithography apparatus LA, such as a space between the patterning device MA and the projection system PL. Here, being immersed may denote not only the wafer W being immersed in the fluid, but also the immersion fluid being located in path of the radiation beams B performing the exposure.

The first location setter PM and an additional location sensor may precisely move so that the patterning device MA is located on the path of the radiation beams B while an exposure process is performed (e.g., after the patterning device MA is withdrawn from a mask library).

When the lithography apparatus LA operates in a step mode, the mask table MT and the wafer table WT are maintained in a halt condition while the overall pattern set of the radiation beams B is projected on the target portion C. The target portion C may be a full shot FS or a partial shot as described with reference to FIGS. 3 and 4. After exposure of the first target portion C, the wafer table WT may move in a horizontal direction with respect to the upper surface of the wafer W so that another target portion C is exposed. In the step mode, the maximum size of an exposure field may define the size of each target portion C imaged during exposure.

When the lithography apparatus LA operates in a scan mode, movement of the mask table MT and/or the wafer table WT may be synchronized so that they move relative to each other while the radiation beams B are projected on the target portion C. The speed and direction of the relative motion of the wafer table WT with respect to the mask table MT may be determined by the enlargement (or reduction) and image reversal of the projection system PL. In the scan mode, the maximum size of the exposure field may limit a width of the target portion C in a horizontal direction during exposure.

When the patterning device MA is a programmable patterning device including a programmable mirror array and programmable LCD panels, the mask table MT may be maintained in a halt state during the exposure process, and the wafer table WT may be moved or scanned so that the radiation beams B are focused on the target portion C. In this mode, the radiation beams B may be a pulsed source. The patterning device MA may be updated to set a new pattern on the radiation beams B according to the movement of the wafer table WT.

Figure 2:
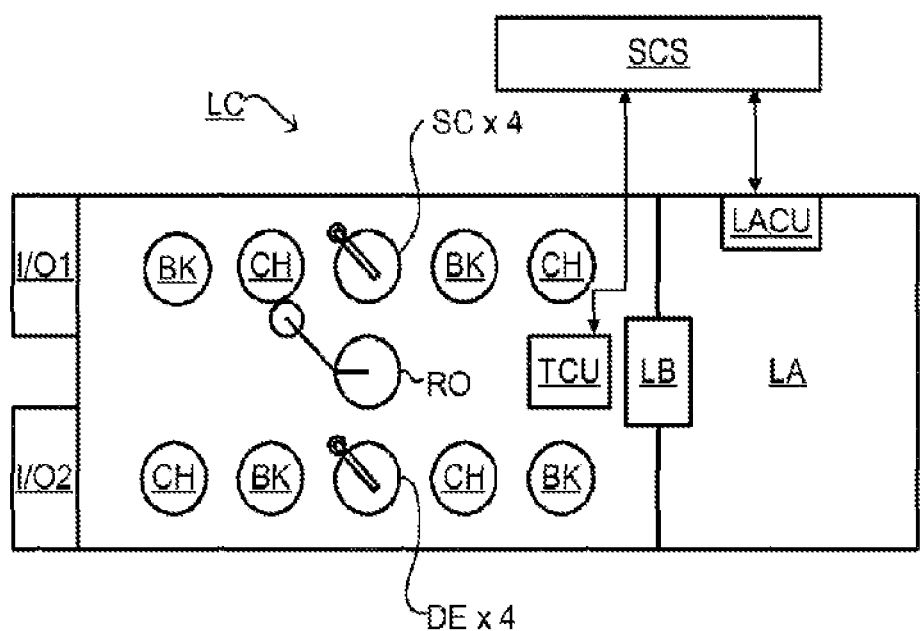
FIG. 2 is a schematic plan view for describing a lithography cell or cluster according to embodiments of the present disclosure.

FIG. 2 is a schematic plan view for describing a lithography cell or cluster according to embodiments of the present disclosure.

Referring to FIG. 2, the lithography apparatus LA may be included in a lithography cell LC also referred to as a litho cell or a litho cluster.

The lithography cell LC may include apparatuses for performing processes before and after exposure of a wafer. The lithography cell LC may include a spin coater SC for depositing photoresist material layers, a developer DE for developing an exposed resist, a chill plate CH, and a bake plate BK.

After a handler robot RO picks up wafers from input/output ports (I/O1 and I/O2) and moves the wafers to different processing apparatuses, the handler robot RO may deliver the wafers to a loading bay LB of the lithography apparatus LA. The handler robot RO, the input/output ports I/O1 and I/O2, and the loading bay LB may be referred to as a track.

A track control unit TCU may control the handler robot RO, the input/output ports I/O1 and I/O2, and the loading bay LB. The track control unit TCU may be controlled by a supervisory control system SCS and the supervisory control system SCS may be controlled by a lithography control apparatus LACU.

In order to expose the wafers accurately and consistently, characteristics such as an overlay error between sequential layers, a line thickness, a critical dimension (CD), etc., may be inspected. Here, the overlay error may be an interlayer misalignment or an error of inter-layer consistency If inspection of the error of the exposure process is performed before other wafers of the same batch are completely exposed, exposure of subsequent wafers may be adjusted. Furthermore, resist layers may be removed from the already exposed wafers and the wafers may be re-processed to improve a yield rate, or the wafers may be discarded. When only certain target portions of the wafer have defects, additional exposure may be performed on only the target portions having the defects.

In some examples, the parameters used to expose the wafers accurately (i.e., to align different layers of the semiconductor structure) may include model functions and overlay functions. The model functions may represent the difference between a designed location of an arbitrary element within a layer an identified location of the arbitrary element. The overlay function may represent the error of the interlayer matching. The overlay function may represent the difference between identified location by at least one of the model function and an actual location of the arbitrary element. In some examples, the model functions and overlay functions may be functions of two variables representing the two horizontal dimensions of the surface of the wafer.

In some embodiments, the litho cell LC may further include an inspection apparatus for inspecting a characteristic of the wafers and determining distribution among the wafers, distribution among different layers of the same wafer, etc. However, it is not limited thereto, and the inspection apparatus may be included in the lithography apparatus LA, or may be a separate device from the litho cell LC and the lithography apparatus LA.

In some embodiments, the inspection apparatus may measure characteristics of the resist layer right after exposure. In some cases, only a very small difference in a refractive index may exist between resist portions exposed to radiation and resist portions not exposed to radiation. Thus, a latent image of the resist before development may have a very low contrast. The sensitivity of some inspection apparatuses may not be high enough to inspect a latent image of a low contrast, and thus, before inspection, a post exposure bake (POB) process may be performed to increase a contrast between the exposed resist portions and the non-exposed resist portions. In some embodiments, the inspection may be performed after either the exposed resist portions or the non-exposed resist portions are removed. In some embodiments, the developed resist image may be measured after transferring a pattern formed on the photoresist to an underlying layer by performing processes, such as etching, ashing, lifting off, etc.

Figure 3:
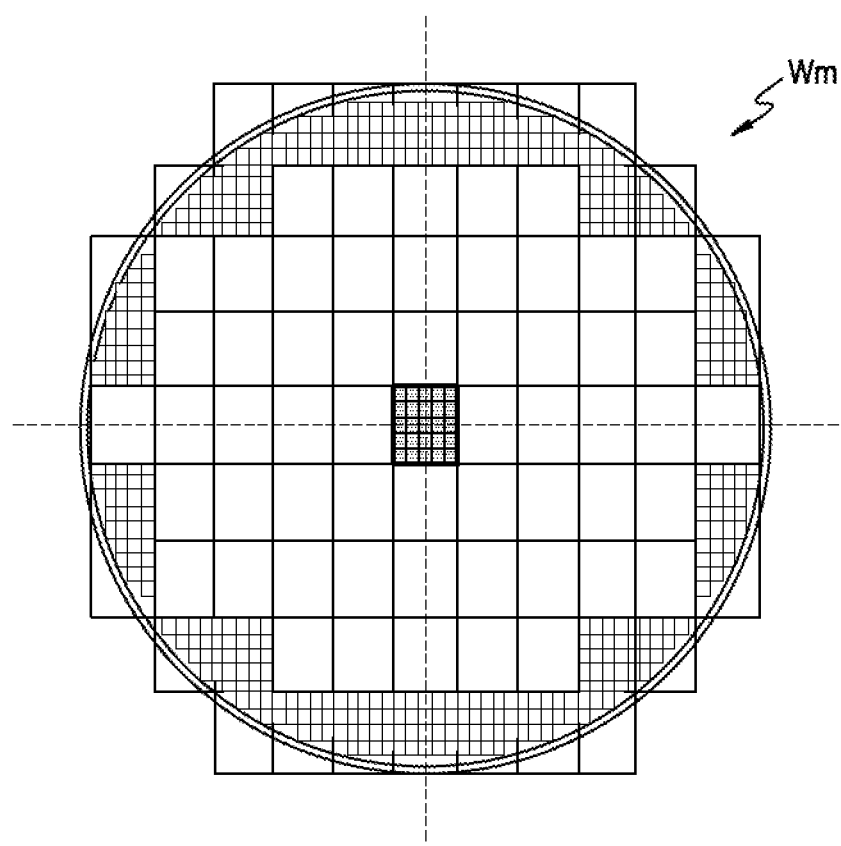
FIGS. 3 and 4 are plan views of a full shot (FS) structure and chips of a wafer of memory chips and logic chips according to embodiments of the present disclosure.
Figure 4:
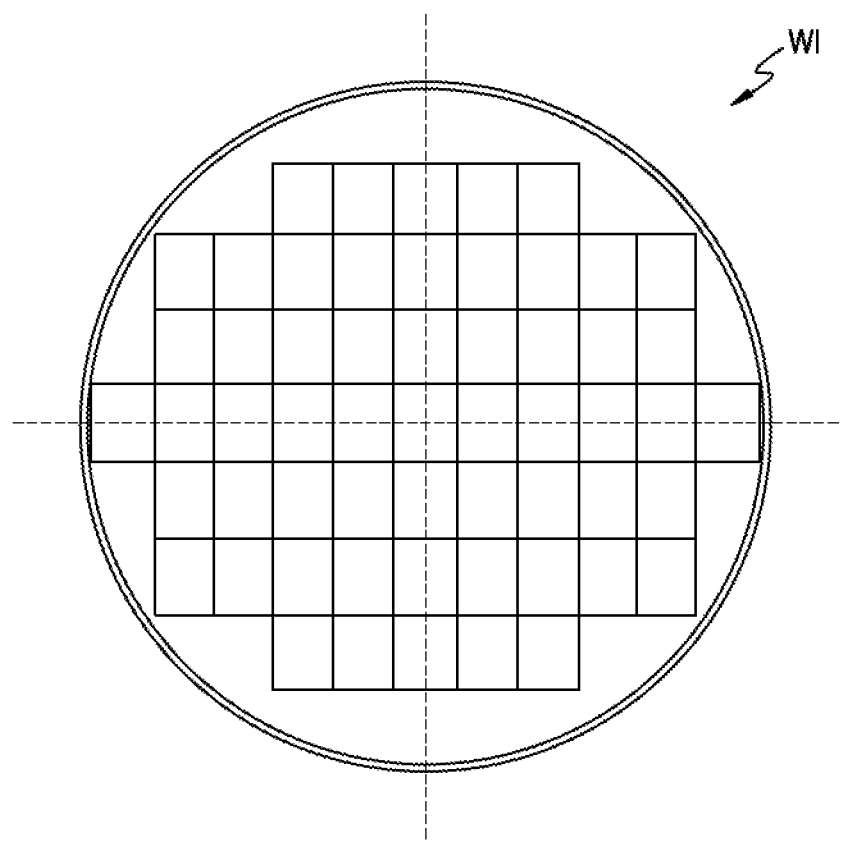

FIGS. 3 and 4 are plan views of a full shot FS structure and chips of a wafer of memory chips and logic chips according to embodiments of the present disclosure. Specifically, FIG. 3 illustrates a wafer Wm of the memory chip and FIG. 4 illustrates a wafer Wl of the logic chip.

Referring to FIG. 3, in the case of the wafer Wm of the memory chip, a plurality of memory chips may be included in one full shot FS. For example, 25 memory chips may be included in one full shot FS. In some embodiments, 87 corresponding shots or scanning processes may be performed to pattern the entirety of the wafer Wm of one memory chip. In FIG. 3, the extent of each shot is illustrated as a large square and each memory chip is illustrated as a small square. The circular border may represent the extent of the wafer Wm.

In the illustrated example, among 87 shots, there are 57 full shots FS (that is, only those shots illustrated as large squares in the wafer Wm may correspond to the full shots FS). Thus, shots at the edge of the wafer Wm may not form a full shot FS. Thus, when exposure is performed at the edge of the wafer Wm, only a portion of a mask pattern may be transferred to the wafer Wm. The full shot FS is not transferred to the edge of the wafer Wm, but a pattern required for the memory chip may still be transferred via a partial transfer of a configured pattern. Thus, memory chips at the edge of the wafer Wm may be used for a product as valid chips.

Referring to FIG. 4, in the case of a wafer Wl of a logic chip, one logic chip may correspond to one full shot FS. In the illustrated example, 57 full shots may be included in the wafer Wl of a logic chip. However, an edge of the wafer Wl of the logic chip may not form one complete logic chip, unlike the memory chip, and thus, exposure is not performed at the edge of the wafer Wl of the logic chip.

Figure 5:
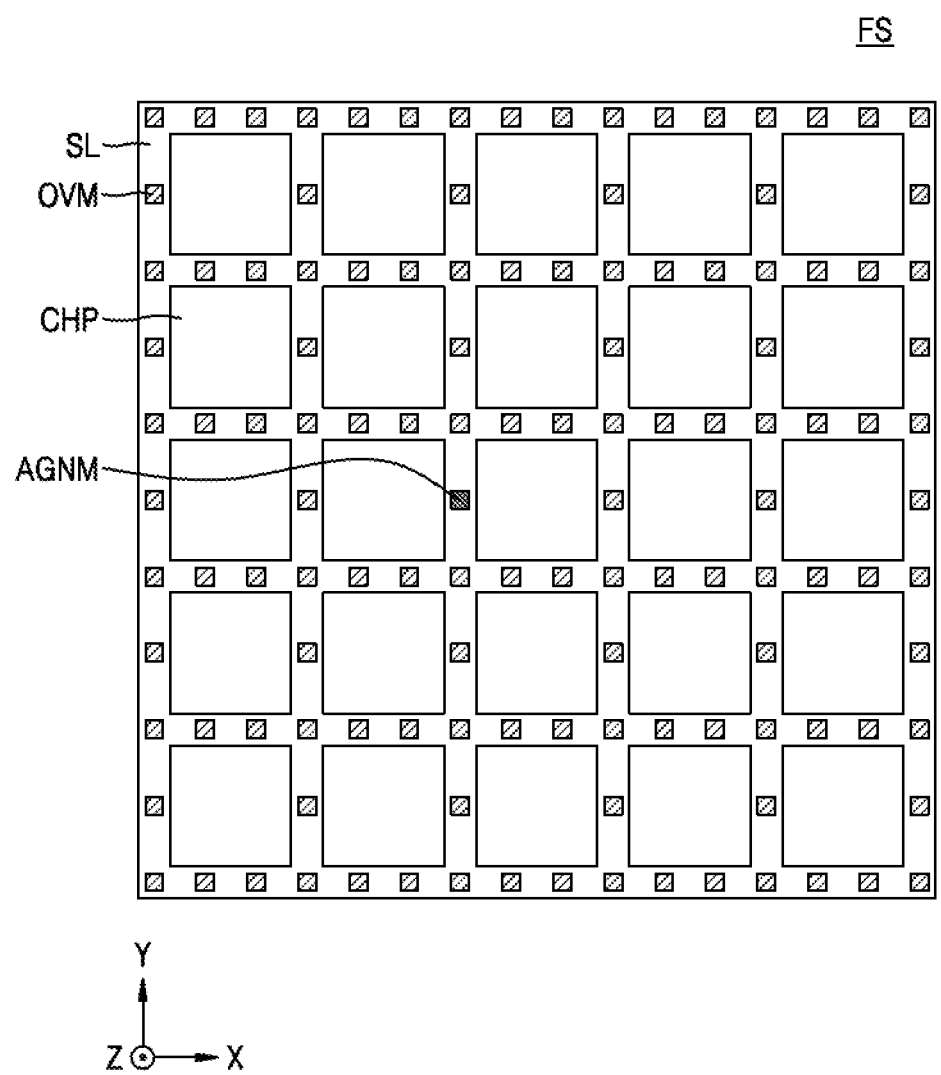
FIG. 5 is a conceptual view showing an FS image in an extreme ultraviolet (EUV) exposure process according to embodiments of the present disclosure.

FIG. 5 is a conceptual view of a full shot image in an EUV exposure process according to embodiments of the present disclosure.

Referring to FIG. 5, in the exposure process, a full shot FS may correspond to the entire mask pattern which may be transferred via one time scanning. Meanwhile, generally, the EUV exposure process may be performed based on reduction projection. For example, the EUV exposure process may be performed based on reduction projection of 4:1. Accordingly, patterns formed on a patterning device, such as the mask pattern, etc., may be reduced to a ¼ size and transferred to the wafer. Here, ¼ is a reduction rate of a length, and may correspond to a reduction rate of ¹⁄₁₆ based on an area. In some embodiments, the full shot FS may have a size of 26 mm in an x axis and a size of 33 mm in a y axis, but is not limited thereto.

The full shot FS may include a scribe lane SL between chips CHP. The scribe lane SL may be arranged between the chips CHP and may separate main chips. The scribe lane SL may be a separation line for separating the chips CHP into separate semiconductor chips in a sawing process.

In some embodiments, the chips CHP may be a memory device. In some embodiments, the chips CHP may be a non-volatile memory device. In some embodiments, the chips CHP may be non-volatile NAND-type flash memory. In some embodiments, the chips CHP may include phase-change random access memory (PRAM), magnetic RAM (MRAM), resistance RAM (ReRAM), ferroelectric RAM (FRAM), NOR flash memory, etc. Also, the chips CHP may be a volatile memory device, such as dynamic RAM (DRAM), static RAM (SRAM), etc., which lose data when power is blocked.

In some embodiments, for example, each chip CHP may be a logic chip, a measuring device, a communication device, a digital signal processor (DSP) or a system-on-chip (SOC).

Also, in FIG. 5, the chips CHP have a profile of an approximate square, but are not limited thereto. For example, the chips CHP may be a display driving integrated circuit (DDI) chip, and in this case, the chips CHP may have a pair of parallel sides longer than the other pair of parallel sides perpendicular thereto.

In some embodiments, one or more alignment marks AGNM and one or more overlay marks OVM may further be formed on the full shot FS. In some embodiments, the alignment mark AGNM and the overlay mark OVM are formed on the scribe lane SL, but the invention is not limited thereto. For example, the alignment mark AGNM and the overlay mark OVM may be formed in the chips CHP.

In some embodiments, the alignment mark AGNM may be a pattern used to accurately set an exposure region in lithography. In some embodiments, the alignment mark AGNM may be arranged to be adjacent to a central portion of the full shot FS, but the invention is not limited thereto. Referring to FIG. 5, one full shot FS includes one alignment mark AGNM, but the invention is not limited thereto. For example, two or more alignment marks AGNM may be arranged in one or more full shots FS. Also, one or more full shots FS may omit the alignment mark AGNM. In some embodiments, the alignment mark AGNM may be substantially the same as the wafer alignment marks P1 and P2 described with reference to FIG. 1.

In some embodiments, the overlay mark OVM may be a pattern for measuring interlayer matching between a layer formed in a previous process and a layer formed in a current process. Here, the interlayer matching may include, for example, an alignment state between adjacent layers, and whether or not a defect occurs, such as a short circuit or an open circuit. In some embodiments, the overlay marks OVM may be more densely arranged than the alignment marks AGNM.

Marks having various functions may be additionally provided on the full shot FS. For example, a mark for testing a characteristic of a manufactured semiconductor device, a mark for measuring a thickness of an uppermost layer after a chemical mechanical polishing (CMP) process, a mark for measuring a thickness of an outermost layer, a mark for measuring a critical line width or an inner thickness via an optical method, etc., may be additionally provided on the full shot FS.

The alignment marks AGNM may be used to determine whether the wafer including the full shots FS are aligned correctly relative to a lithography apparatus LA. For example, the alignment marks AGNM may be detected using one or more colors of light, and based on the detection of these marks, one or more model functions may be determined. Each model function may represent a vector field, where each vector in the vector field corresponds to an offset of a point on the wafer (i.e., Wm or Wl) relative to a designed position for that particular point. In some cases, each color of light that is used to detect the alignment marks AGNM may be used to generated a model function. The model functions may then be combined to form a combined model function, which may be used in positioning subsequent wafers.

Figure 6:
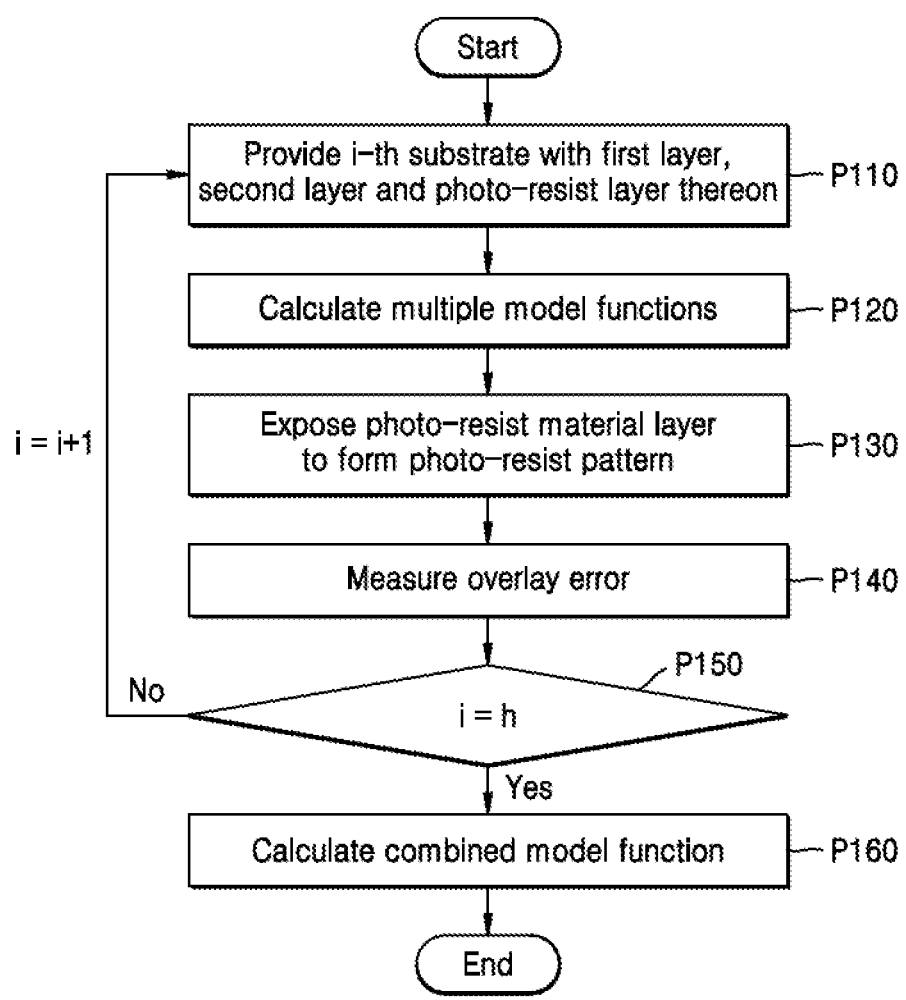
FIG. 6 is a flowchart of a method of exposure according to embodiments.
Figure 7:
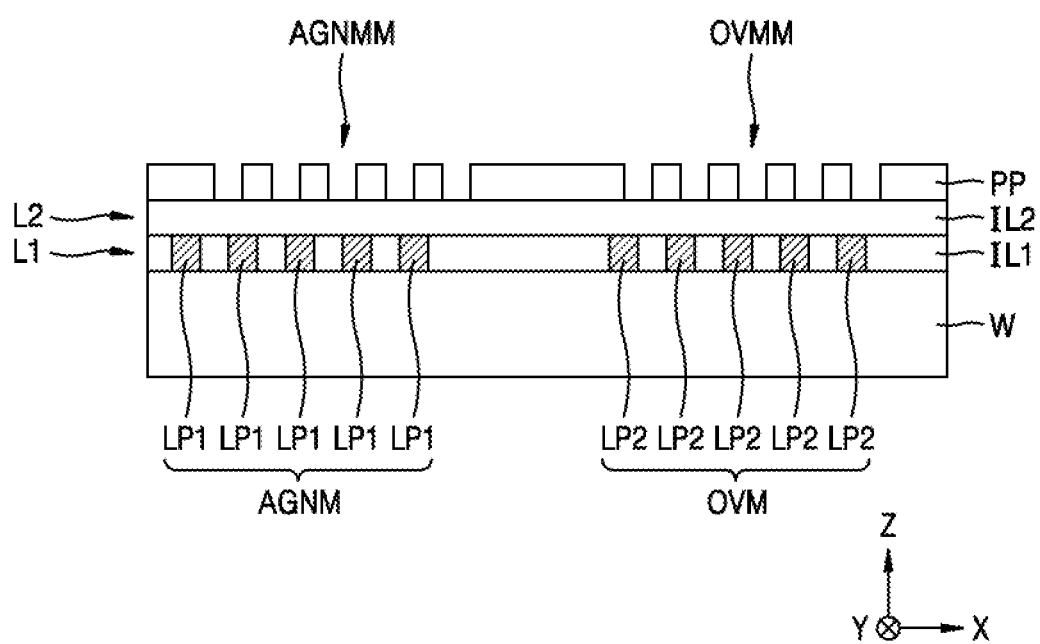
FIG. 7 is a cross-sectional view for describing a method of exposure according to embodiments.
Figure 8:
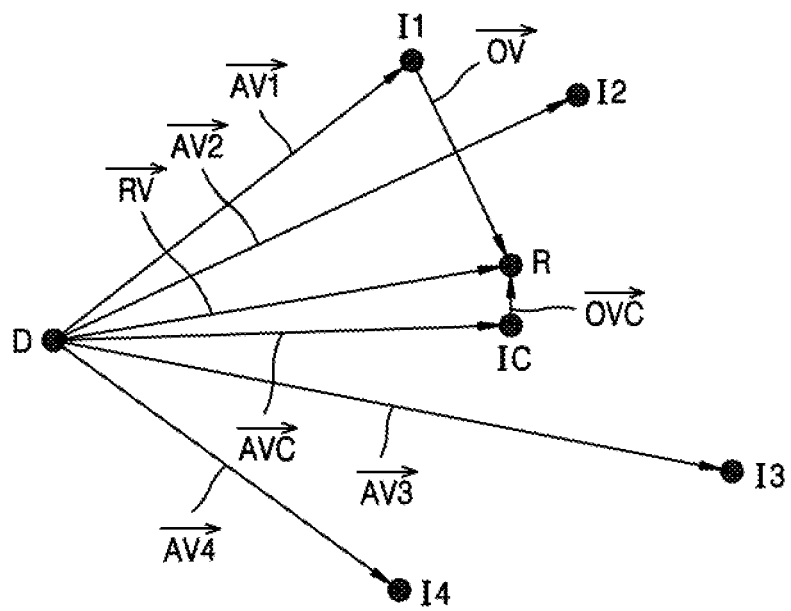
FIG. 8 is a conceptual view for describing a method of exposure according to embodiments.

FIG. 6 is a flowchart of a method of exposure according to embodiments. FIG. 7 is a cross-sectional view for describing a method of exposure according to embodiments. FIG. 8 is a conceptual view for describing a method of exposure according to embodiments.

Referring to FIGS. 6 and 1, an $i^{th}$ wafer W may be provided to the LA in process P110. Here, i is an ordinal number referring to a wafer on which processes P120 to P150 are to be performed. At a start point, i may be 1.

A first layer L1 may be arranged on the wafer W, a second layer L2 may be arranged on the first layer L1, and a photoresist material layer (not shown) may be arranged on the second layer L2. Referring to FIG. 7, the wafer W and the first layer L1 contact each other, but embodiments of the inventive concept are not limited thereto. For example, other layers may be arranged between the wafer W and the first layer L1.

The first layer L1 may include a first insulating layer IL1 and first patterns LP1 and second patterns LP2. The first layer L1 may be a layer on which processes for forming a circuit are completely performed. The first layer L1 may include a semiconductor material. The first insulating layer IL1 may include an insulating material.

In some embodiments, the first and second patterns LP1 and LP2 may be line patterns arranged to be apart from each other in a first direction (an X direction) and extending in a second direction (a Y direction). In some embodiments, the first and second patterns LP1 and LP2 may form a line and space shape. In some embodiments, the first patterns LP1 may form the alignment mark AGNM. In some embodiments, the second patterns LP2 may form the overlay mark OVM.

Referring to FIG. 7, the first and second patterns LP1 and LP2 extend in the second direction (the Y direction), but the invention is not limited thereto. For example, the first and second patterns LP1 and LP2 may extend in the first direction (the X direction) or may extend in a direction inclined with respect to the first and second directions (the X and Y directions).

In some embodiments, the first patterns LP1 may have an optically different composition from the first insulating layer IL1. In some embodiments, the first patterns LP1 may include a material having an optically different property from that of the first insulating layer IL1. In some embodiments, the first patterns LP1 may include a material having a different refractive index from that of the first insulating layer IL1. In some embodiments, when the first insulating layer IL1 includes silicon nitride, the first patterns LP1 may include silicon oxide or a conductive material. In some embodiments, when the first insulating layer IL1 includes silicon oxide, the first patterns LP1 may include silicon nitride or a conductive material.

The second layer L2 may include a second insulating layer IL2. In some embodiments, the second layer L2 may include a semiconductor material. The second layer L2 illustrated in FIG. 7 may represent a layer which is not yet patterned. In some embodiments, the second insulating layer IL2 may include the same material as the first insulating layer IL2, but is not limited thereto. In some embodiments, the second insulating layer IL2 may include a different material from the first insulating layer IL1.

A photoresist material layer used to form a photoresist pattern PP may be provided on the wafer by using spin coating, etc., and may be patterned in a sequential process to be used as a photomask for patterning the second layer L2. In some embodiments, the photoresist material layer may be any one of a negative type which becomes insoluble when exposed or a positive type which becomes soluble when exposed.

Referring again to FIG. 6, a plurality of model functions may be calculated in process P120. Here, the plurality of model functions may indicate a difference between a designed location and an identified location of an arbitrary element on the wafer W. In some embodiments, the plurality of model functions may be continuously defined with respect to coordinates on a surface of the wafer W in the first and second directions (the X and Y directions).

In some embodiments, calculating the plurality of model functions may include identifying a location of the alignment mark AGNM. In some embodiments, the location of the alignment marks AGNM may be identified via a diffraction signal of light. In some cases, the alignment marks AGNM may have an asymmetric shape (e.g., due to a systemic error of an exposure process used to create them).

The asymmetry of the alignment marks AGNM and other optical factors may cause different results when detecting the alignment mark AGNM using different wavelengths (i.e., colors) of light.

Thus, in some embodiments the location of the alignment mark AGNM may be identified by a plurality of different wavelengths. In some embodiments, the location of the alignment mark AGNM may be identified by first through fourth lights having different frequencies. In some embodiments, the first light may have a frequency in a frequency bandwidth of far-infrared radiation and the second light may have a frequency in a frequency bandwidth of infrared rays. In some embodiments, the third light may be visible rays (for example, a red ray) and the fourth light may be visible rays (for example, a green ray) having a higher frequency than the third light.

In some examples, the frequency bandwidth of far-infrared radiation may denote an electromagnetic wave having a wavelength equal to or higher than about 25 μm, the frequency bandwidth of near-infrared rays may denote an electromagnetic wave having a wavelength between about 0.75 μm and about 3 μm, the frequency bandwidth of red visible rays may denote an electromagnetic wave having a wavelength between about 620 nm and about 750 nm, and the frequency bandwidth of green visible rays may denote an electromagnetic wave having a wavelength between about 495 nm and about 570 nm. However, the frequency bandwidth ranges are not limited thereto.

Referring to FIG. 8, various locations of arbitrary elements (for example, an overlay mark, an alignment mark insulating pattern and/or a circuit pattern) on an upper surface of a wafer are illustrated. A designed location D among them is a location of the arbitrary elements based on a design of a semiconductor device to be realized on the wafer. In some cases, the alignment mark AGNM may have an asymmetric shape, unlike a designed shape of the alignment mark AGNM, due to systemic error of an exposure process. The asymmetry of the alignment mark AGNM may affect diffraction of light to cause a color offset. Accordingly, locations of the alignment mark AGNM, the locations being identified by the first through fourth lights, may be different from one another. First through fourth identified locations I1, I2, I3, and I4 may be the locations of the arbitrary elements as identified by the first through fourth lights, respectively.

In some embodiments, after information of the location of the alignment mark AGNM formed on the entire surface of the wafer is obtained by using the first through fourth lights, first through fourth model functions may be defined by using the obtained information of the location. In some embodiments, obtaining information of locations of the alignment marks AGNM may include identifying a location of at least one of the alignment marks AGNM by using the first through fourth lights. In some embodiments, obtaining information of locations of the alignment marks AGNM may include identifying locations of all of the alignment marks AGNM by using the first through fourth lights. In some embodiments, the first through fourth model functions may be generated by fitting differences between a designed location of the alignment mark AGNM and the locations of the alignment marks AGNM measured by the first through fourth lights respectively. In some embodiments, the first through fourth model functions may be continuous functions with respect to coordinates in the first and second directions (the X and Y directions). The first through fourth model functions may correspond to the first through fourth lights, respectively.

In FIG. 8, vectors connecting between the designed location D and the first through fourth identified locations I1, I2, I3, and I4 are referred to as first through fourth alignment vectors $\overrightarrow{AV1}$, $\overrightarrow{AV2}$, $\overrightarrow{AV3}$, and $\overrightarrow{AV4}$, respectively. A limited number of alignment marks AGNM (referring to to FIG. 6) may be arranged on the wafer, and thus, only the limited first through fourth alignment vectors $\overrightarrow{AV1}$, $\overrightarrow{AV2}$, $\overrightarrow{AV3}$, and $\overrightarrow{AV4}$ are determined based on measurement. In some embodiments, a continuous spatial distribution of the first through fourth alignment vectors $\overrightarrow{AV1}$, $\overrightarrow{AV2}$, $\overrightarrow{AV3}$, and $\overrightarrow{AV4}$ may be obtained by applying a known fitting technique. In some embodiments, the first through fourth alignment vectors $\overrightarrow{AV1}$, $\overrightarrow{AV2}$, $\overrightarrow{AV3}$, and $\overrightarrow{AV4}$ at an arbitrary location on the wafer may be represented by the first through fourth model functions in the first direction (AXq(x, y), corresponding to the X direction) and the first through fourth model functions in the second direction (AYq(x, y), corresponding to the Y direction), as in Equation 1.

$$\overrightarrow{AVq}(x,y)=(AXq(x,y),AYq(x,y)) \quad \text{[Equation 1]}$$

Here, q is an integer of any one between 1 and 4 and is an ordinal number to denote to which of the first through fourth model functions AXq(x,y) and AYq(x,y) correspond. The small letters x and y denote coordinate values to indicate the locations on the wafer in the first direction (the X direction) and the second direction (the Y direction), respectively.

Here it is described that the first through fourth model functions are obtained by using frequency bandwidths of the first through fourth lights. However, it is for convenience of explanation, and the inventive concept is not limited thereto. For example, the location of the alignment mark AGNM may be identified by using two, three, or five or more lights having different frequencies, and then, two, three, or five or more model functions may be obtained based on the identified locations.

Also, based on an order of diffractive light used to identify the location of the alignment mark AGNM, the location of the alignment mark AGNM may be differently identified even if the light having the same wavelength is used. In other words, diffractive lights having the same wavelength while having different orders may set different alignment vectors and models. That is, when light of a single wavelength passes through a diffraction grating, it may be diffracted to each side in multiple orders. The multiple diffraction orders may correspond to the peaks associated with the interference of light through the multiple slits of the grating. The order of the light at each alignment mark AGNM may arrive at different angles and different intensities, which may impact the corresponding model functions.

In some embodiments, the first through fourth model functions may be defined with respect to each of the first direction (the X direction) and the second direction (the Y direction). Thus, the total eight model functions may be defined. In some embodiments, the first through fourth model functions may correspond to linear combination of basis functions. In some embodiments, the basis may include any one of a monomial, a discontinuous Chebyshev polynomial, and a Zernike polynomial, but the basis is not limited thereto. For example, the basis may be an arbitrary complete basis set in a function space. Here, a complete basis set denotes a set of basis functions including a least number of basis functions required to represent an arbitrary function in the function space. In some embodiments, the basis may be an arbitrary discrete orthogonal polynomial. In some examples, coefficients on the basis set may correspond to so-called "parameters" in a lithography alignment technique.

When the basis functions are monomials, the first through fourth model functions in the first direction (the X direction) may be defined by Equation 2 below.

$$AXq(x, y) = \\ CXq1 \cdot B1(x, y) + CXq2 \cdot B2(x, y) + CXq3 \cdot B3(x, y) + \ldots = \\ \sum_n CXqnBn(x, y) \quad \text{[Equation 2]}$$

In Equation 2, q may be an ordinal number to refer to any one of the first through fourth model functions. Specifically, AX1(x,y) may be the first model function in the first direction (the X direction), AX2(x,y) may be the second model function in the first direction (the X direction), AX3(x,y) may be the third model function in the first direction (the X direction), and AX4(x,y) may be the fourth model function in the first direction (the X direction).

Also, in Equation 2, Bn(x,y) may be a basis of a model function. In some embodiments, the model function may be a monomial having a form of $x^a y^b$ (a and b are integers equal to or greater than 0), a Zernike polynomial, a discontinuous Chebyshev polynomial, or a unit basis of an arbitrary appropriate basis set.

Similarly, the first through fourth model functions in the second direction (the Y direction) may be defined by Equation 3 below.

$$AYq(x, y) = \\ CYq1 \cdot B1(x, y) + CYq2 \cdot B2(x, y) + CYq3 \cdot B3(x, y) + \ldots = \\ \sum_n CYqnBn(x, y) \quad \text{[Equation 3]}$$

A definition of a variable of the first through fourth model functions AYq(x,y) in the second direction (the Y direction) is substantially the same as the definition of the variable of the first through fourth model functions AXq(x,y) in the first direction (the X direction) described above.

The first through fourth model functions in the first direction (the X direction) and the first through fourth model functions in the second direction (the Y direction) may represent functions defining a relation between the first layer L1 and the second layer L2. In FIG. 7, it is described that for example, two layers are provided and the first through fourth model functions between the first layer L1 and the second layer L2 are provided. However, when a plurality of layers are formed on the wafer W, a plurality of first model functions, a plurality of second model functions, a plurality of third model functions, and a plurality of fourth model functions may be provided in correspondence thereto. For example, when the total Q layers are formed on the wafer W, Q−1 first model functions, Q−1 second model functions, Q−1 third model functions, and Q−1 fourth model functions may be provided.

Referring again to FIG. 6, the photoresist material layer may be exposed to form a photoresist pattern PP in process P130.

In some embodiments, the exposure of the photoresist material layer may be performed by using any one of the first through fourth model functions. Hereinafter, for convenience of explanation, it will be described that the exposure is performed by using the first model function. When the photoresist material layer is a positive type, the region of the photoresist material layer being exposed may vertically overlap a circuit pattern to be formed on the second layer L2. When the photoresist material layer is a negative type, the region of the photoresist material layer not being exposed may vertically overlap the circuit pattern to be formed on the second layer L2.

In some embodiments, a signal measured by the first light corresponding to the first model function may have an intensity greater than signals measured by the second to fourth lights. In some embodiments, a variation of coefficients of the basis functions of the first model function among semiconductor structures may be less than a variation of coefficients of the basis functions of the second to fourth model functions among semiconductor structures. In some embodiments, the residual between the locations of alignment marks identified by the first light and determined by the first model function may be less than the residual between the locations of alignment marks identified by the second to fourth lights and determined by the corresponding second to fourth model functions Next, the photoresist pattern PP may be formed by performing a developing process. For example, in a sequential process, the second layer L2 is etched using the photoresist pattern PP, and then a pre-configured material layer may be deposited on the photoresist pattern PP. Thereafter, the photoresist pattern PP may be formed by using an ashing process, etc., to form a desired circuit pattern on the second layer L2. The photoresist pattern PP may be transferred to the second insulating layer IL2 of the second layer L in a sequential process.

In FIG. 7, a pattern including openings of the photoresist pattern PP formed on the alignment mark AGNM may be referred to as an alignment mark mold AGNMM and a pattern including openings of the photoresist pattern PP formed on the overlay mark OVM may be referred to as an overlay mark mold OVMM.

Referring to FIGS. 6, 7, and 8, an overlay error may be measured in process P150. A technique of measuring the overlay error is referred to as wafer metrology. The wafer metrology may include measuring a thickness of stacked layers, measuring a critical dimension of a formed pattern, and measuring matching between overlapping layers. In some embodiments, the measuring of the overlay error may be performed by the litho cell LC described with reference to FIG. 2.

The measuring of the overlay error may include comparing a horizontal location of the overlay mark OVM formed on the first layer L1 and a horizontal location of the overlay mark mold OVMM of the photoresist pattern PP, but is not limited thereto. For example, after the exposure process and before the developing process, a latent image of the exposed photoresist material layer may be compared with the overlay mark OVM. In some cases, a projection optics box (POB) process may be additionally performed to compare the latent image of the photoresist material layer with the overlay mark OVM of the first layer L1. Also, it is possible to compare the overlay mark OVM of the first layer L1 with an overlay mark of the second layer L2 after forming a circuit pattern, the overlay mark, etc. on the second layer L2 by using the photoresist pattern.

In some embodiments, the measuring of the overlay error may be performed by a fifth light having a different wavelength from the first through fourth lights, but the invention is not limited thereto. For example, the measuring of the overlay error may be performed by using any of the first through fourth lights. Also, the overlay error may be measured by a plurality of lights having different wavelengths.

In some embodiments, based on substantially the same method as the calculation of the first through fourth model functions, an overlay function, which is a continuous spatial distribution of overlay errors in the first and second directions (the X and Y directions), may be calculated. The overlay functions in the first and second directions (the X and Y directions) may be defined by Equations 4 and 5 below.

$$OX(x, y) = \overline{CX1} \cdot B1(x, y) + \overline{CX2} \cdot B2(x, y) + \overline{CX3} \cdot B3(x, y) + \overline{CX4} \cdot B4(x, y) + \ldots = \sum_n \overline{CXn} Bn(x, y)$$ [Equation 4]

$$OY(x, y) = \overline{CY1} \cdot B1(x, y) + \overline{CY2} \cdot B2(x, y) + \overline{CY3} \cdot B3(x, y) + \ldots = \sum_{n=0}^{n} \sum_{k=0}^{n} \overline{CYn} \cdot Bn(x, y)$$ [Equation 5]

In Equations 4 and 5, $\overline{CXn}$ and $\overline{CYn}$ are coefficients of each basis and Bn(x,y) is a basis, which may be the same as the basis of the first through fourth model functions.

In some embodiments, the basis of the overlay function OX(x,y) in the first direction (the X direction) and the overlay function OY(x,y) in the second direction (the Y direction) may be the same as the basis of the first through fourth model functions. For example, when the basis of the first through fourth model functions is a monomial, the basis of the overlay functions OX(x,y) and OY(x,y) may be a monomial. When the basis of the first through fourth model functions is a Chebyshev polynomial, the basis of the overlay functions OX(x,y) and OY(x,y) may be a Chebyshev polynomial. When the basis of the first through fourth model functions is a Zernike polynomial, the basis of the overlay functions OX(x,y) and OY(x,y) may be a Zernike polynomial.

In some embodiments, the overlay error may be indicated by a vector connecting the first identified location I1 and a real location R. In some embodiments, the overlay error may be visualized by the overlay vector $\overrightarrow{OV}$ of FIG. 6. In a manner similar to the description of the first through fourth alignment vectors $\overrightarrow{AV1}$, $\overrightarrow{AV2}$, $\overrightarrow{AV3}$, and $\overrightarrow{AV4}$, the overlay vector $\overrightarrow{OV}$ at an arbitrary location of the wafer may be represented by the overlay function as in Equation 6 below.

$$\overrightarrow{OV}(x,y) = (OX(x,y), OY(x,y))$$ [Equation 6]

The overlay vector $\overrightarrow{OV}$ and the first alignment vector $\overrightarrow{AV1}$ with respect to an arbitrary point on the wafer may be obtained in processes P120 through P140, and referring to FIG. 6, Equation 7 below may be derived by a vector operation of the overlay vector $\overrightarrow{OV}$ and the first alignment vector $\overrightarrow{AV1}$.

$$\overrightarrow{AV1} + \overrightarrow{OV} = \overrightarrow{RV}$$ [Equation 7]

Here, a real location vector $\overrightarrow{RV}$ is as vector indicating a difference between the designed location D and the real location R of the overlay mark OVM. The real location vector $\overrightarrow{RV}$ may be obtained by a vector sum of the overlay vector $\overrightarrow{OV}$ and the first alignment vector $\overrightarrow{AV1}$. The real location R of an arbitrary element on the wafer may be obtained by using the real location vector $\overrightarrow{RV}$. The overlay vector $\overrightarrow{OV}$ is determined by comparing the overlay mark OVM and the overlay mark mold OVMM while the first alignment vector $\overrightarrow{AV1}$ is determined by comparing the alignment mark AGNM and a circuit design. Thus, objects from which the vectors are derived are different. However, by obtaining the first model function and the overlay function, which are continuous spatial distributions thereof, a first alignment vector $\overrightarrow{AV1}$ and a real location vector $\overrightarrow{RV}$ for an arbitrary position on the wafer may be obtained.

Referring again to FIG. 6, it may be identified in process P160 whether processes P120 through P140 are performed with respect to an $h^{th}$ wafer (i.e., the final wafer in the process). By taking both processes P110 and P150 into account, it may be known that processes P120 through P150 are performed on the total h wafers W. Here, the flowchart illustrates that the h wafers W are sequentially inspected in a series of processes P110 through P160. However, the inventive concept is not limited thereto. For example, the h wafers may be simultaneously inspected. As used herein, "h" may be a sufficiently large number to guarantee high reliability of a combined model function to be described below. For example, "h" may be the number of semiconductor wafers included in one lot. However, it is not limited thereto, and h may be part of the number of semiconductor wafers included in one lot or the number of semiconductor wafers included in a plurality of lots.

In process 150, when the number of wafers on which processes P120 through P150 are performed is less than h (No), the process may return to process P110 and a new wafer may be provided to the lithography apparatus LA (i=i+1). However, when the number of wafers on which processes P120 through P150 are performed is h (Yes), the process may proceed to process P170.

In process P160, the combined model function may be calculated. The combined model function may be a basis-dependent weighted sum of the first through fourth model functions.

Here, the basis-dependent weighted sum denotes that different model functions or different basis functions are multiplied by different factors, based on a weight function. That is, the combined model function may be composed of the combination of the first through fourth model functions and the basis of each of the first through fourth model functions may be multiplied by a different factor. The combined model function may be described by Equation 8 below.

$$ACX(x, y) = (wX11 \cdot CX11 + \quad \text{[Equation 8]}$$
$$wX12 \cdot CX21 + wX13 \cdot CX31 + wX14 \cdot CX41) \cdot$$
$$B1(x, y) + (wX21 \cdot CX12 + wX22 \cdot CX22 +$$
$$wX23 \cdot CX32 + wX24 \cdot CX42) \cdot B2(x, y) +$$
$$(wX31 \cdot CX13 + wX32 \cdot CX23 + wX33 \cdot CX33 +$$
$$wX34 \cdot CX43) \cdot B3(x, y) +$$
$$(wX41 \cdot CX14 + wX42 \cdot CX24 + wX43 \cdot CX34 +$$
$$wX44 \cdot CX44) \cdot B4(x, y) + \ldots =$$
$$\sum_{n=0}^{} \sum_{q=1}^{4} wXnq \cdot CXqn \cdot Bn(x, y)$$

Similar to the description of the model functions in the first direction (the X direction), substantially the same model functions may be calculated with respect to the model functions in the second direction (the Y direction), which may be defined by Equation 9 below.

$$ACY(x, y) = (wY11 \cdot CY11 + \quad \text{[Equation 9]}$$
$$wY12 \cdot CY21 + wY13 \cdot CY31 + wY14 \cdot CY41) \cdot$$
$$B1(x, y) + (wY21 \cdot CY12 + wY22 \cdot CY22 +$$
$$wY23 \cdot CY32 + wY24 \cdot CY42) \cdot B2(x, y) +$$
$$(wY31 \cdot CY13 + wY32 \cdot CY23 + wY33 \cdot CY33 +$$
$$wY34 \cdot CY43) \cdot B3(x, y) +$$
$$(wY41 \cdot CY14 + wY42 \cdot CY24 + wY43 \cdot CY34 +$$
$$wY44 \cdot CY44) \cdot B4(x, y) + \ldots =$$
$$\sum_{n=0}^{} \sum_{q=1}^{4} wYnq \cdot CYqn \cdot Bn(x, y)$$

In some embodiments, a combined identified location IC (referring to FIG. 8) may be determined. The location IC may correspond to the location of the arbitrary element on the wafer, as identified by the combined model functions (e.g., the combined first and second model functions, or alternatively, the first through fourth model functions). Accordingly, a combined alignment vector $\overrightarrow{AVC}$, which is a vector connecting the designed location D and the combined identified location IC of the arbitrary element on the wafer W, and a combined overlay vector $\overrightarrow{OVC}$, which is a difference between the combined identified location IC and the real location R of the arbitrary element on the wafer W, may be determined.

In some embodiments, weight functions wXqn and wYqn may be determined to minimize a wafer to wafer variance of a combined overlay error. The variance of the combined overlay error may be a variance of an element of the combined overlay vector $\overrightarrow{OVC}$, in the first (X) direction or the second (Y) direction, with respect to the entire surface of the wafer W. According to some embodiments, weight functions wXqn and wYqn may be determined to minimize the average of the combined overlay vectors $\overrightarrow{OVC}$ of all of the wafers to be measured and a variance of differences of the combined overlay vector $\overrightarrow{OVC}$ of all of the wafers. The weight function wXqn in the first direction (the X direction) may be determined to minimize a variance of coordinates in the first direction (the X direction) of the overlay vector $\overrightarrow{OVC}$. The weight function wYqn in the second direction (the Y direction) may be determined to minimize a variance of coordinates in the second direction (the Y direction) of the overlay vector $\overrightarrow{OVC}$. In some embodiments, obtaining of the weight functions wXqn and wYqn may be performed based on iteration, a partial least square method, etc.

In some embodiments, comparing of the overlay error may include comparing the average overlay error plus three times the overlay standard deviation but the invention is not limited thereto. In some embodiments, in order to obtain the variance of the overlay error, the variance with respect to the entire surface of the wafer may be calculated as described above, but the invention is not limited thereto. For example, when the Zernike polynomial is used as the basis of the model function, each basis may separately affect the variance. That is, when each basis of the Zernike polynomial is multiplied by a certain factor, a contribution of a corresponding basis to the variance may be calculated, so that the weight function may be calculated based on each basis.

In FIG. 7, one combined model function is provided between the first layer and the second layer. However, when a plurality of layers are formed on the wafer, a plurality of combined model functions may be provided correspondingly. For example, when the total Q layers are formed, Q−1 combined model functions may be provided.

As semiconductor devices are thinned and shortened, demand for precision of a facility or device (for example, a lithography apparatus) for manufacturing semiconductor devices has been increased. Accordingly, interlayer alignment during exposure and an overlay error after exposure, may be actively compensated for. As described above, to identify the interlayer alignment during exposure, alignment marks (e.g., having a shape of comprising one or more lines and spaces) may be used. When there is deformation of the alignment marks, the reliability of the interlayer alignment is deteriorated.

In some systems, after model functions are calculated by using a plurality of lights, a combined model function is calculated by simply linearly combining the model functions. However, this method may not compensate for the asymmetry of the alignment marks or the overlay marks depending on the horizontal location on the wafer. Thus, as the location dependency of the asymmetry of the alignment marks or the overlay marks is increased, the reliability of the combined overlay mark is decreased.

Thus, according to embodiments of the present disclosure, the combined model function may be calculated by the weight functions having different values depending on the basis functions. Thus, even when the location dependency of the asymmetry of the alignment marks or the overlay marks is increased, the combined model function may still be reliable.

Figure 9:
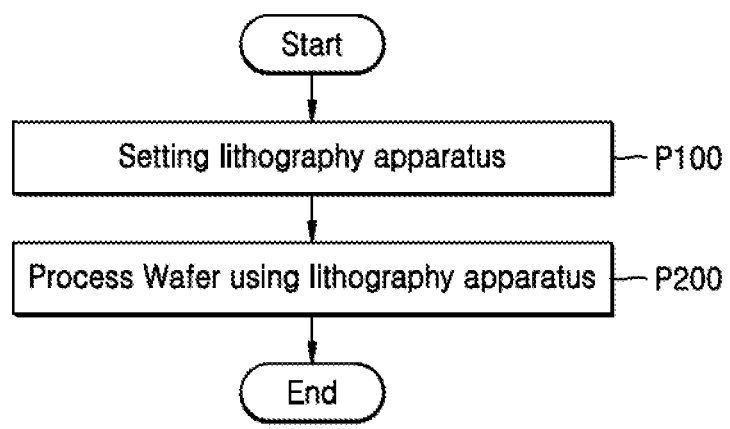
FIG. 9 is a flowchart of a method of exposure according to embodiments.

FIG. 9 is a flowchart of a method of exposure according to embodiments.

Referring to FIGS. 1 and 9, the lithography apparatus LA may be set in process P100. In some embodiments, the setting of the lithography apparatus LA may include calculating the combined model function described with reference to FIGS. 5 through 8. In some embodiments, the setting of the lithography apparatus LA may include obtaining the weight functions wXqn and wYqn described with reference to FIGS. 5 through 8. In some embodiments, process P100 may include processes P110 through P160 described in FIG. 6.

Next, in process P200, the wafer may be processed by using the set lithography apparatus LA. The processing of the wafer by using the set lithography apparatus LA may include calculating the combined model function by using the alignment marks formed on the wafer and exposing the wafer by using the calculated combined model function.

In some embodiments, the combined model function may be obtained by forming the first through fourth model functions by identifying a location of at least one of the alignment marks formed on the entire surface of the wafer by using the first through fourth lights and combining the first through fourth model function by using the weight functions wXqn and wYqn set in process P100.

In some embodiments, the first semiconductor structures for setting the LA in process P100 may be the same or similar to the second semiconductor structures processed in process P200. In some embodiments, the first and second semiconductor structures may have the characteristics illustrated in FIGS. 3 through 5 and FIG. 7 and may include the wafer, at least two semiconductor layers, and the photoresist material layer.

While the inventive concept has been particularly shown and described with reference to embodiments thereof, it will be understood that various changes in form and details may be made therein without departing from the spirit and scope of the following claims.

What is claimed is:

1. A method of exposing a semiconductor structure, the method comprising:
providing a semiconductor structure to a lithography apparatus, the semiconductor structure comprising a wafer, a first layer arranged on the wafer and comprising a plurality of alignment marks and a plurality of overlay marks, a second layer arranged on the first layer, and a photoresist material layer arranged on the second layer;
identifying locations of the plurality of alignment marks by using a plurality of lights having different wavelengths;
obtaining a plurality of model functions each representing differences between designed locations of the plurality of alignment marks and locations of the plurality of alignment marks identified by the plurality of lights;
forming a photoresist pattern comprising a plurality of overlay mark molds by exposing the photoresist material layer by using a first model function from among the plurality of model functions;
measuring overlay errors representing misalignment between the plurality of the overlay marks and the plurality of overlay mark molds;
obtaining a combined model function by combining the plurality of model functions using a weight function,
wherein each of the plurality of model functions comprises basis functions, and
wherein the weight function assigns a different weight for each of the basis functions of each of the plurality of model functions.

2. The method of claim 1, further comprising:
obtaining a real location of an arbitrary element of the first layer by using the overlay errors and the first model function.

3. The method of claim 2, wherein the semiconductor structure is provided in a multiple number to the lithography apparatus, and
the weight function is determined such that a variance of a combined overlay error, which represents a difference between a location of the arbitrary element determined by the combined model function and the real location of the arbitrary element, has a least value.

4. The method of claim 3, wherein the weight function is determined based on iteration or a partial least square method.

5. The method of claim 2, wherein the semiconductor structure is provided in a multiple number to the lithography apparatus, and
the weight function is determined such that an average of a combined overlay error, which represents a difference between a location of the arbitrary element determined by the combined model function and the real location of the arbitrary element, has a least value.

6. The method of claim 1, wherein the plurality of model functions have values with respect to a plurality of locations on the wafer.

7. The method of claim 6, wherein the obtaining of the plurality of model functions comprises, after identifying the locations of the plurality of alignment marks by using the plurality of lights, obtaining a combination of the basis functions so that a difference between the identified locations and designed locations of the plurality of alignment marks is fit based on the combination of the basis functions.

8. The method of claim 1, further comprising, after the measuring of the overlay errors, obtaining an overlay function, which is a function of the overlay errors with respect to an arbitrary horizontal location on the wafer.

9. The method of claim 8, wherein the obtaining of the overlay function comprises obtaining a combination of the basis functions to fit the overlay error based on the obtained combination of the basis functions.

10. A method of exposing a semiconductor substrate, the method comprising:
providing a first semiconductor structure to a lithography apparatus, the first semiconductor structure comprising a first wafer having an upper surface extending in a first direction and a second direction, a first layer arranged on the first wafer and comprising a plurality of first alignment marks and a plurality of first overlay marks, a second layer arranged on the first layer, and a first photoresist material layer arranged on the second layer;
obtaining first and second model functions each representing differences between designed locations of the plurality of first alignment marks and locations of the plurality of first alignment marks identified by first and second lights having different wavelengths, wherein each of the first and second model functions is a linear combination of basis functions;
forming a first photoresist pattern comprising a plurality of first overlay mark molds by exposing the first photoresist material layer by using the first model function;
measuring overlay errors representing misalignment between the plurality of the first overlay marks and the plurality of first overlay mark molds;
obtaining a weight function by combining the first and second model functions to provide a first combined model function by assigning a different weight for each of the basis functions; and
exposing second semiconductor structures designed to be same as the first semiconductor structure, using the weight function.

11. The method of claim 10, further comprising:
obtaining a real location of an arbitrary element of the first layer by using the overlay errors and the first model function.

12. The method of claim 11, wherein the first semiconductor structure is sequentially provided to the lithography apparatus in a multiple number, and the weight function is determined such that an average of a variance of a combined overlay error representing a difference between a location of the arbitrary element determined based on the first combined model function and the real location of the arbitrary element with respect to the plurality of first semiconductor structures has a least value.

13. The method of claim 12, wherein the weight function is determined based on iteration or a partial least square method.

14. The method of claim 10, wherein the first model function and the second model function are represented by Equations 1 and 2 below, $$MF1(x, y) = \sum_{n=0} C1n \cdot Bn(x, y) \quad \text{[Equation 1]}$$

$$MF2(x, y) = \sum_{n=0} C2n \cdot Bn(x, y), \quad \text{[Equation 2]}$$

where x and y are coordinates with respect to locations on a wafer in the first direction and the second direction, respectively, Bn(x,y) is a basis function, and C1n and C2n are coefficients of the basis function Bn(x,y) determined by fitting.

15. The method of claim 14, wherein the first combined model function is determined by Equation 3 below, $$CMF(x, y) = (w11 \cdot C11 + w12 \cdot C21) \cdot B1(x, y) + \quad \text{[Equation 3]}$$
$$(w21 \cdot C12 + w22 \cdot C22) \cdot B2(x, y) +$$
$$(w31 \cdot C13 + w32 \cdot C23) \cdot B3(x, y) +$$
$$(w41 \cdot C14 + w42 \cdot C24) \cdot B4(x, y) + \ldots =$$
$$\sum_{n=0} \sum_{q=1}^{2} wnq \cdot Cqn \cdot Bn(x, y),$$

where wnq is the weight function and q is an ordinal number to refer to any one of the first model function and the second model function.

16. The method of claim 10,
wherein each of the second semiconductor structure comprises:
a second wafer;
a third layer arranged on the second wafer and comprising a plurality of second alignment marks and a plurality of second overlay marks;
a fourth layer arranged on the first layer; and
a second photoresist material layer arranged on the fourth layer;
wherein the exposing of the second semiconductor structures comprises:
obtaining third and fourth model functions each representing differences between designed locations of the plurality of second alignment marks and locations of the plurality of second alignment marks identified by the first and second lights; and
obtaining a second combined model function by combining the third and fourth model functions using the weight function.

17. The method of claim 16, wherein the exposing of the second semiconductor structures further comprises:
exposing the second photoresist material layer based on the second combined function.

18. A method of exposing a semiconductor substrate, the method comprising:

providing a semiconductor structure to a lithography apparatus, the semiconductor structure comprising a wafer, a first layer arranged on the wafer and comprising a plurality of alignment marks and a plurality of overlay marks, a second layer arranged on the first layer, and a photoresist material layer arranged on the second layer;

obtaining first through fourth model functions each representing differences between designed locations of the plurality of alignment marks and locations of the plurality of alignment marks identified by first through fourth lights having different wavelengths, wherein each of the first through fourth model functions is a linear combination of basis functions;

obtaining a combined model function by combining a plurality of model functions using a weight function, the weight function assigning a different weight for each of the basis functions of each of the plurality of model functions.

exposing the semiconductor structure using the combined model function.

19. The method of claim 18, wherein the weight function minimizes a variance or an average of a combined overlay error representing a difference between a location of an arbitrary element on the first layer determined based on the combined model function and a real location of the arbitrary element.

20. The method of claim 18, wherein each of the basis functions comprises at least one of a monomial, a discontinuous Chebyshev polynomial, and a Zernike polynomial.

* * * * *